United States Patent
Gudino et al.

(10) Patent No.: US 8,294,464 B2
(45) Date of Patent: Oct. 23, 2012

(54) ON-COIL CURRENT MODE CLASS D RF POWER AMPLIFIER IN HIGH FIELD PARALLEL TRANSMISSION MRI

(76) Inventors: Natalia Gudino, Cleveland Heights, OH (US); Jeremiah A. Heilman, University Heights, OH (US); Mark A. Griswold, Shaker Heights, OH (US)

( * ) Notice: Subject to any disclaimer, the term of this patent is extended or adjusted under 35 U.S.C. 154(b) by 398 days.

(21) Appl. No.: 12/750,780

(22) Filed: Mar. 31, 2010

(65) Prior Publication Data

US 2011/0241682 A1 Oct. 6, 2011

(51) Int. Cl.
*G01V 3/00* (2006.01)
(52) U.S. Cl. ........................... 324/318; 324/322
(58) Field of Classification Search .......... 324/300–322; 600/407–445; 327/94; 323/314; 330/253; 438/318
See application file for complete search history.

(56) References Cited

U.S. PATENT DOCUMENTS

| | | | |
|---|---|---|---|
| 5,166,620 A * | 11/1992 | Panosh | 324/322 |
| 5,382,916 A * | 1/1995 | King et al. | 330/253 |
| 6,329,260 B1 * | 12/2001 | DeJong et al. | 438/318 |
| 6,822,448 B2 * | 11/2004 | Watkins et al. | 324/318 |
| 7,671,595 B2 | 3/2010 | Griswold et al. | |
| 7,714,581 B2 * | 5/2010 | Erickson et al. | 324/322 |
| 8,068,897 B1 * | 11/2011 | Gazdzinski | 600/476 |

* cited by examiner

*Primary Examiner* — Brij Shrivastav

(57) ABSTRACT

Example systems, apparatus, circuits, and so on described herein concern parallel transmission in high field MRI. One example apparatus includes a balun network that produces out-of-phase signals that are amplified to drive current-mode class-D (CMCD) field effect transistors (FETs) that are connected by a coil that includes an LC (inductance-capacitance) leg. The LC leg is to selectively alter the output analog RF signal and the analog RF signal is used in high field parallel magnetic resonance imaging (MRI) transmission.

18 Claims, 7 Drawing Sheets

Prior Art Figure 1

ON-COIL CURRENT MODE CLASS D RF POWER AMPLIFIER IN HIGH FIELD PARALLEL TRANSMISSION MRI

BACKGROUND

Magnetic resonance imaging (MRI) involves the transmission of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Using multiple receivers facilitates speeding up signal reception, which in turn may reduce scan time. Similarly, multiple transmitters may be used in parallel transmission techniques. Using multiple transmitters may facilitate speeding up a transmission process, which in turn may facilitate volumetric excitation, selective isolation, and other very high speed features. However, conventional parallel transmission techniques have encountered issues with scaling, fidelity, and synchronization.

Conventional systems may have attempted to parallelize their existing RF transmitters. Thus, conventional systems may have relied on multiple, individually powered, single channel, analog-in-analog-out RF transmitters for parallel transmission. These systems tended not to scale well due to cabling duplication, power transmitter duplication, control duplication, and other issues. Even when a small number (e.g., 4) of transmitters were employed, these systems may not have produced desired fidelity. For example, conventional systems may have had complicated power distribution management and may have been difficult to synchronize. Additionally, conventional systems typically had poor isolation between coils, resulting in degraded performance. Furthermore, these systems may have required each element in an array to be tuned and matched, which is a very time-consuming procedure.

Conventional systems may also have been limited by their use of relatively low power (e.g., <50 W), low efficiency class A or class AB amplifiers. While some systems may have included on-coil series and/or shunt-fed class-D amplifiers, even these conventional systems have suffered from several limitations including inadequate detuning and low efficiency. Proposed systems that indicate that they may achieve higher efficiency still appear to lack adequate control mechanisms. Due, at least in part, to these limitations, conventional systems may not have produced desired levels of amplitude and/or phase control and thus may have had less than desirable fidelity.

U.S. Pat. No. 7,671,595 ("the '595 patent) to Griswold et al. which issued on Mar. 2, 2010, and is entitled "On-coil Switched Mode Amplifier for Parallel Transmission in MRI" describes an on-coil current-mode class D ("CMCD") amplifier that may be used to produce MRI transmission coil excitations at desired RF frequencies. The on-coil CMCD amplifier is capable of performing within or proximate to the bore of the MRI magnet or within less than one wavelength of the amplifier from the transmit coil. Providing an on-coil amplifier allows digital control signals to be sent to the coil assembly, improving synchronization between the transmission coils while reducing interference, cross talk, physical space requirements associated with cables, and heating normally associated with parallel transmission MRI systems. The on-coil CMCD amplifier disclosed in the '595 patent is well adapted for use in MRI systems having a typical magnetic field strength between 1 and 5 Tesla.

Today there is intensive research effort in high-field MRI systems having a magnetic field strength of around 7 Tesla. MRI systems having a higher magnetic field strength typically benefit from a higher signal-to-noise ratio (SNR) and consequently higher spatial and temporal resolution. The Larmor frequency at higher magnetic field strengths is proportionally greater as well (e.g. around 300 MHz for a 7T system). While the higher magnetic field is beneficial in many ways, the higher magnetic field and higher attendant excitation frequencies present unique challenges for developing electronic circuits that can operate on or proximate to the transmit coil.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

DETAILED DESCRIPTION

Figure 1:
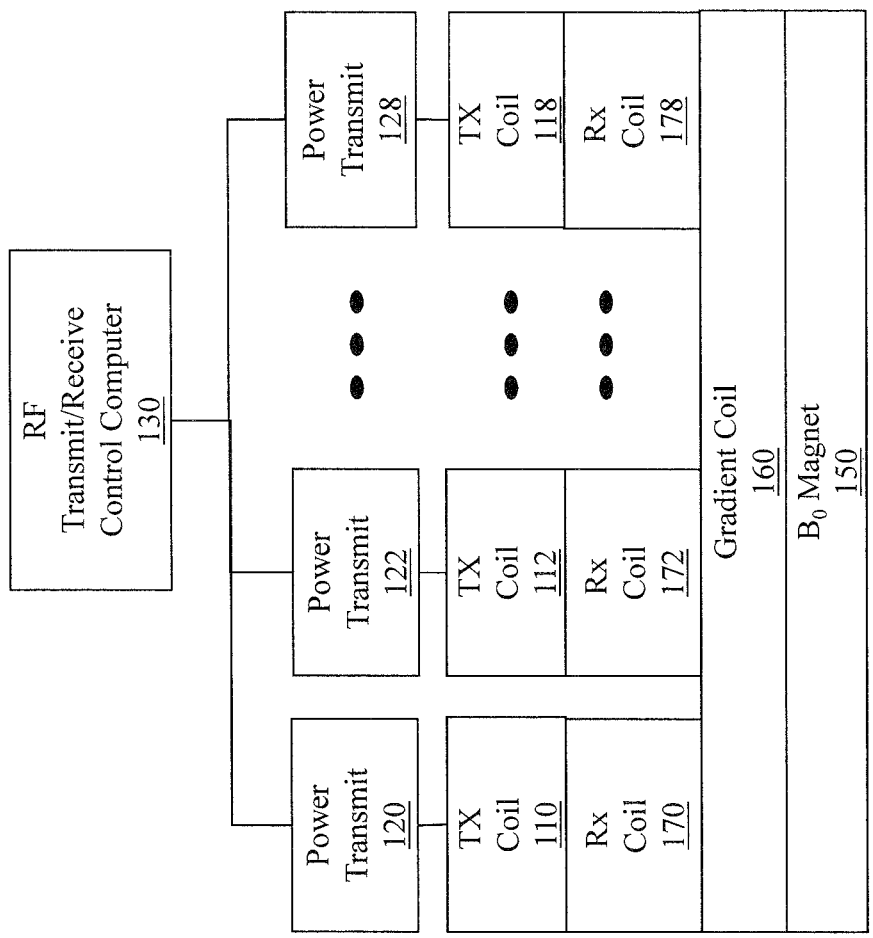
FIG. 1 illustrates portions of a conventional parallel MRI apparatus.

Prior Art FIG. 1 illustrates a conventional parallel transmission MRI system that used multiple independent external transmitters (e.g., 120, 122 . . . 128), multiple transmit coils (e.g., 110, 112 . . . 118) and multiple receive coils (e.g., 170, 172 . . . 178). Once again the system would also have included other components (e.g., main field magnet 150, gradient coil 160, and so on). This conventional system could perform both parallel acquisition and parallel transmission. However, this system may have suffered from the limitations described above including, for example, scaling, synchronization, interference between coils, and so on. The system presented each transmit coil with an analog signal and each transmit coil produced an analog signal. Each transmit coil was powered by a separate power transmitter and was connected to its power transmitter by a separate coaxial cable. The power transmitters may have been controlled by a computer 130.

The system illustrated in Prior Art FIG. 1 did not scale well due to power transmitter proliferation, tuning and matching requirements, cable proliferation and coupling, and power consumption increases. The sheer volume of the multiple power transmitters and multiple cables made physical design difficult. The power required to drive all the transmitters and the resulting heat produced by all these transmitters created additional design issues. Furthermore, cable paths and coil design may have produced cross talk issues, interference issues, and so on. Furthermore, synchronization of the transmit coils was difficult, if possible, to achieve, and even included cable length and connection engineering issues.

Figure 2:
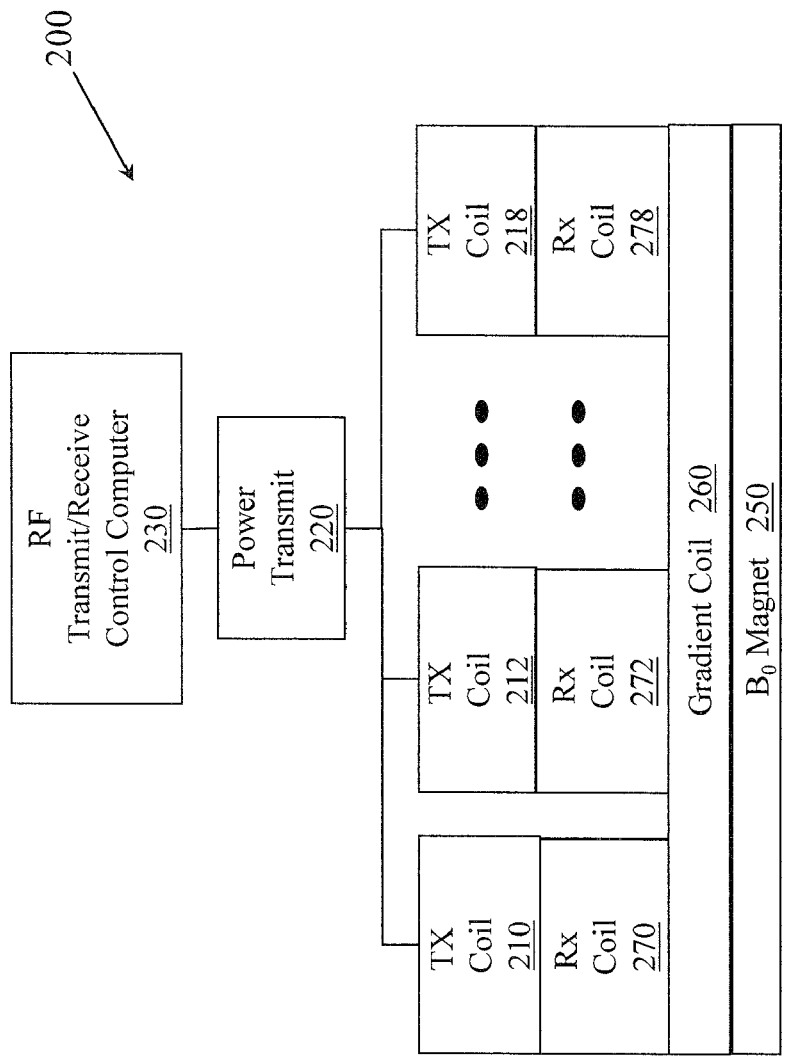
FIG. 2 illustrates portions of a high field parallel MRI apparatus configured with an on-coil switched mode amplifier.

FIG. 2 illustrates an example system 200 that uses multiple independent transmit coils (e.g., 210, 212 . . . 218) and multiple receive coils (e.g., 270, 272 . . . 278). The transmit coils illustrated in FIG. 2 (and FIG. 3) are described in more detail in the '595 patent. The transmit coils have on-coil switched mode amplifiers that facilitate improved parallel transmission in MRI. The transmit coils may be powered by digital controllers 220 (e.g., power transmitters 220) that are controlled by a computer 230. The transmit coils may receive a digital signal and produce an analog signal having improved characteristics. The system also includes other standard MRI apparatus elements (e.g., main field magnet 250, gradient coils 260, and so on).

Figure 3:
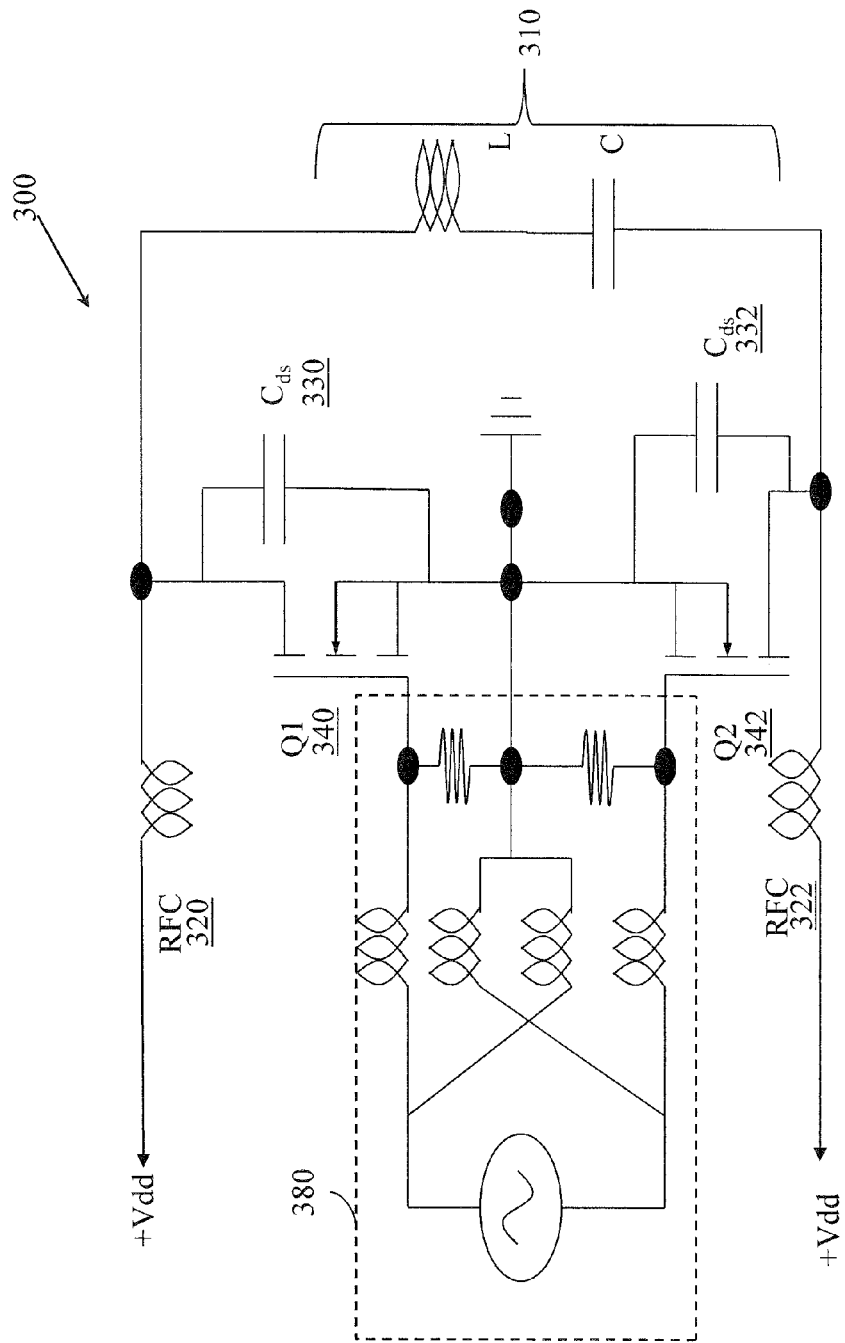
FIG. 3 illustrates a current-mode class-D (CMCD) amplifier topology for use in parallel MRI transmission involving on-coil switched-mode amplification.

FIG. 3 illustrates an example CMCD amplifier topology 300 similar to the CMCD described in the '595 patent. A coil configured with this topology 300 may be referred to as an L-C-switched-mode coil. In the illustration, the coil is represented by the series LC leg 310. The L refers to inductance in the coil 310 and the C refers to capacitance in the coil 310. The two chokes RFC (e.g., 320, 322) act as current sources. The drain-source capacitances $C_{ds}$ (e.g., 330, 332) are in series with the coil 310. Alternative shunting of an applied DC voltage to ground as an FET is driven to saturation produces excitation at desired RF frequencies. The signal that drives the FETs to saturation is provided by linear circuit 380 that includes an RF transmission unit. The coil 310 terminals are attached between the drains of two FETs (Q1 340, Q2 342) and tuned so that the circuit is series resonant when one of the FETs is switched on.

While the topology 300 shown in FIG. 3 is well adapted for use in conventional MRI systems that operate with moderate (e.g., about 1-5 T) magnetic field strength, its operation may be degraded in high field (e.g., 7 T) MRI systems. This is due in part to increased impedances present in inductive components and parasitic impedances generated by FETs at the higher excitation frequencies (e.g., approximately 300 MHz) transmitted by the high field MRI systems. These additional high frequency induced impedances may result in large power transmission losses not experienced in lower field applications.

Figure 4:
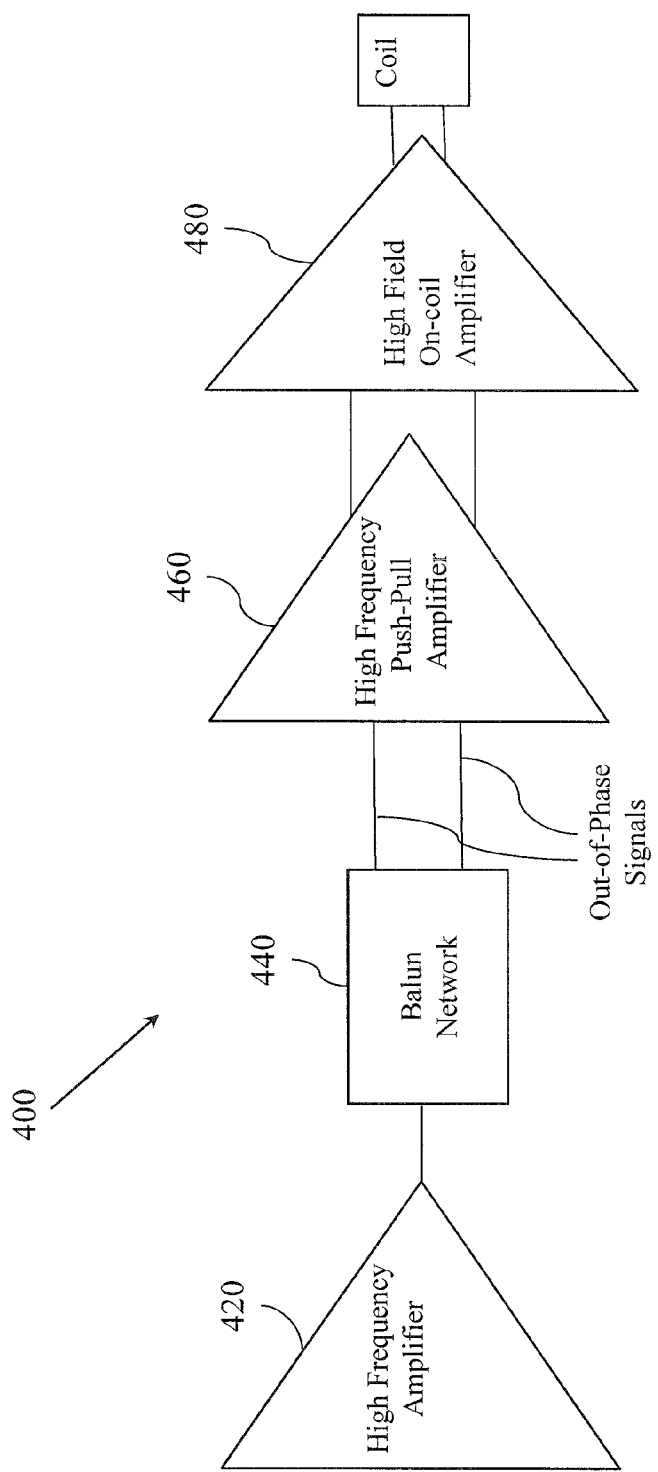
FIG. 4 illustrates a CMCD amplifier topology for use in high field parallel MRI transmission.

FIG. 4 illustrates a schematic of a topology 400 that is adapted for use with high field MRI systems that include an on-coil CMCD amplifier such as the one described in the '595 patent. The topology 400 includes an RF signal generator (not shown) which may be digitally controlled. The RF signal generator generates a high frequency RF signal (e.g., 300 MHz). The output of the signal generator is amplified through a high frequency amplifier 420.

The output of the high frequency amplifier 420 is fed to a balun network 440 that inputs the RF signal with respect to ground and converts the input RF signal into a pair of first and second balanced out-of-phase signals, with respect to ground, at the high frequency. The balun network 440 can be implemented with any type of network that converts a single input voltage with respect to ground into two balanced 180 degree out-of-phase signals (e.g., wound wire transformers, wavelength-related lengths of transmission line).

The balun network 440 may be implemented using a quarter-wavelength transmission line that has a length substantially equal to an integer multiple of one quarter of the wavelength of the RF signal generated by the signal generator (e.g., $^{n(\lambda)}/4$, where n is an integer). The quarter-wavelength transmission line converts the input RF signal into balanced 180 degree out-of-phase signals. In high-field MRIs where the RF signal will have shorter wavelengths (e.g., approximately 70 cm at 7 T), it becomes feasible to employ a quarter-wavelength transmission line (e.g., 17.5 cm) to generate the out-of-phase signals that are ultimately utilized to drive the on-coil CMCD amplifier. While the length of the transmission line would be necessarily longer in lower field strengths, it should be understood by one of skill in art that MRI systems operating with lower magnetic field strengths may also employ the balun network 440 implemented using a quarter-wavelength transmission line. The out-of-phase signals are amplified by a high frequency push-pull amplifier 460 before being provided to a high field on-coil CMCD amplifier 480 that may be adapted for use in a high field environment.

Figure 5:
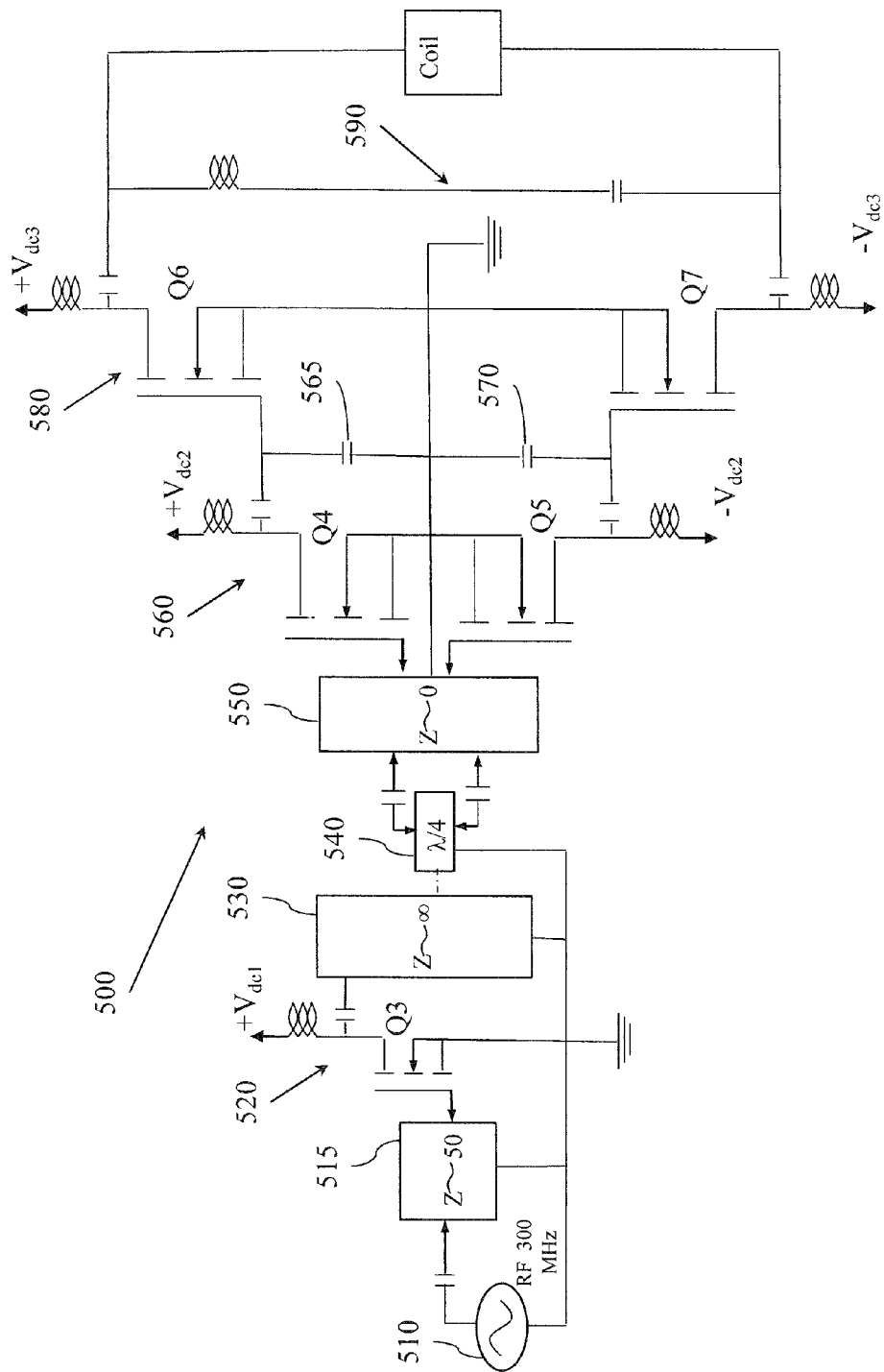
FIG. 5 illustrates a CMCD amplifier topology for use in high field parallel MRI transmission.

FIG. 5 illustrates a more detailed schematic of an example topology 500 that is adapted for use with 7 T field MRI systems that include an on-coil CMCD amplifier such as the one described in the '595 patent. The topology 500 includes a 300 MHz RF signal generator 510 coupled to a 50 ohm impedance matching network 515. A class A amplifier 520 amplifies the RF signal. In the illustrated topology, the class A amplifier is implemented with a FET Q3 that is connected at its drain to a first DC voltage $V_{dc1}$ and driven by the RF signal applied at its gate. The amplified RF signal is input to a balun network that includes a quarter-wavelength transmission line 540.

The quarter-wavelength transmission line 540 may be implemented using a semi-rigid length of coaxial cable having a length that is equal to an integer multiple of one quarter of the wavelength of the RF signal. An inner conductor of the coaxial cable is connected to the RF signal at the input and a first conductor at the output. An outer shield layer of the coaxial cable is grounded at the input and is connected to a second conductor at the output. The first and second conductors provide the out-of-phase signals, with respect to ground. The resulting quarter-wavelength transmission line thus functions as a balun and produces two balanced, out-of-phase signals. Impedance matching networks 530 and 550 can be designed to minimize power losses through the quarter-wavelength transmission line 540.

In the illustrated topology, the balanced, out-of-phase signals output by the quarter-wavelength transmission line 540 drive a class B push-pull amplifier 560 that boosts the peak voltage of the signal to a voltage $V_{dc2}$ that is sufficient to efficiently switch an on-coil CMCD amplifier 580. The push-pull amplifier 560 includes two FETs Q4, Q5 connected in a common source arrangement with drains connected to gates of FETs Q6, Q7 that are part of the on-coil CMCD amplifier 580.

The topology 500 includes components configured to optimize performance in high field strength applications. For example capacitors 565, 570 connected between the gate and source of the FETs Q6, Q7 are configured to match impedance to higher values and avoid a dramatic loss of gain from the push-pull amplifier 560. An L-C filter 590 is disposed in parallel between the on-coil CMCD amplifier 580 and the transmit coil. The L-C filter 590 is configured to resonate with the parasitic impedance generated by the FETs Q6, Q7 operating at 300 MHz to attenuate harmonics that are typically present with switched mode amplifiers. The L-C filter 590 also provides decoupling from transmitting neighboring coils due to the high impedance seen from the coil at higher frequencies. While the topology 500 is described in connection with a high field strength MRI, it will be apparent to one of skill in the art that one or more the various illustrated circuit components may also be advantageously employed with respect to MRIs of other field strengths.

Figure 6:
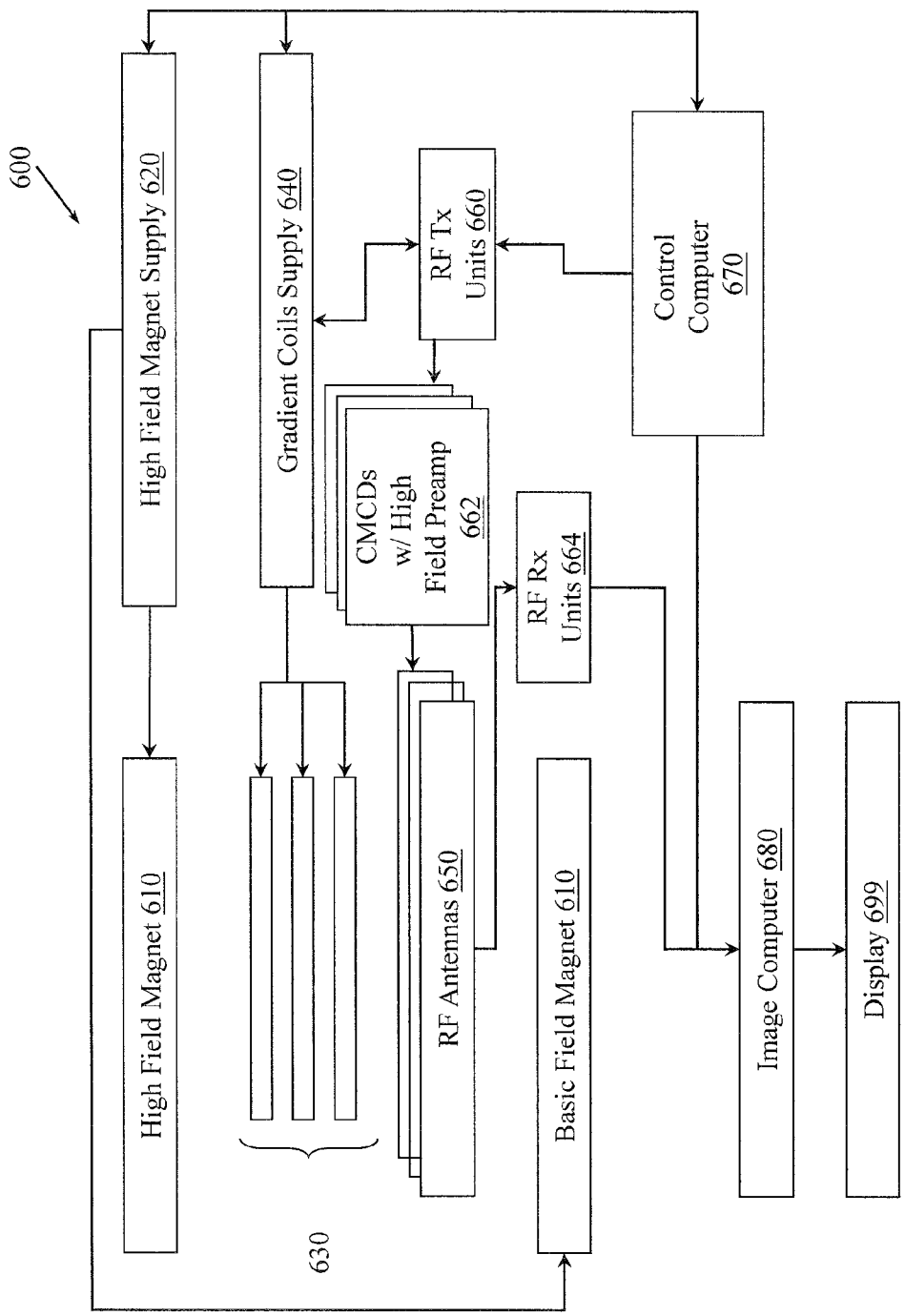
FIG. 6 illustrates a high field MRI apparatus configured with multiple CMCDs with switched mode amplifiers.

FIG. 6 illustrates an example MRI apparatus 600 configured with a set of on-coil switched mode amplifiers to facilitate improved parallel transmission of analog RF signals used in high field MRI systems. The on-coil switched mode amplifiers may be configured like those illustrated in FIGS. 4-5. The RF antennas 650 may correspond in part to L-C leg 310 (FIG. 3). The CMCDs 662 may correspond in part to CMCD topologies 400, 500. The RF transmission (TX) units 660 may correspond to RF signal generator 510.

The apparatus 600 includes a basic field magnet(s) 610 that produce a high strength magnetic field and a basic field magnet supply 620. Ideally, the basic field magnets 610 would produce a uniform $B_0$ field. However, in practice, the $B_0$ field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In one example, the RF antennas 650 may be considered to correspond, at least in part, to element L-C leg 310 (FIG. 3). In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to a CMCD 662, which may manipulate the signal and provide a different signal to an RF antenna 650. The signal may be manipulated (e.g., amplified) according to approaches described above in connection with FIGS. 4-5.

The gradient coils supply 640 and the RF transmission units 660 may be controlled, at least in part, by a control computer 660. In one example, the control computer 670 may be programmed to perform methods like those described herein. The magnetic resonance signals received from the RF antennas 650 can be employed to generate an image, and thus may be subject to a transformation process like a two dimensional FFT that generates pixilated image data. The transformation can be performed by an image computer 680 or other similar processing device. The image data may then be shown on a display 699. While FIG. 6 illustrates an example MRI apparatus 600 that includes various components connected in various ways, it is to be appreciated that other MRI apparatus may include other components connected in other ways.

In one example, MRI apparatus 600 may include control computer 670 and a digital controller operably connected to the CMCDs 662. The CMCDs 662 may include a set of L-C-switched-mode coils operably connected to the digital controller. In one example, a member of the set of L-C-switched-mode coils may be individually controllable by the control computer 670. Additionally, the control computer 670 may provide an L-C-switched-mode coil with a digital control signal and the L-C switched-mode coil may output an analog RF signal based, at least in part, on the digital control signal.

In one example, the set of L-C switched mode coils may be operably connected to the control computer 670 by dedicated connections. The dedicated connections may include a copper cable, a fiber optic cable, a wireless connection, and so on. In one example, the L-C switched-mode coil may be operably connected to a local memory that stores bit patterns that control production of the analog RF signal. Thus, the digital control signal may identify a stored bit pattern.

Figure 7:
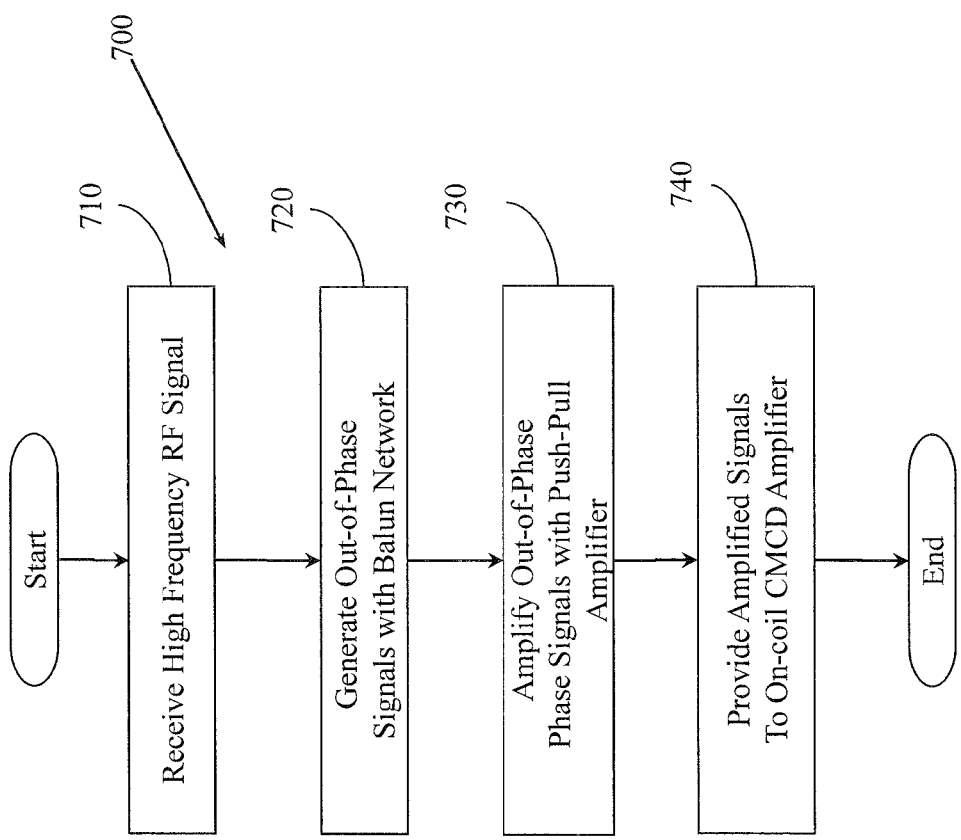
FIG. 7 illustrates a method associated with parallel transmission in high field magnetic resonance imaging.

FIG. 7 illustrates a method 700 associated with high field parallel transmission in MRI. Method 700 includes, at 710 receiving an RF signal having a high frequency. At 720 first and second out-of-phase signals are generated by passing the RF signal through a balun network. At 730, the method includes amplifying the first and second out-of-phase signals with a push-pull amplifier. At 740 the amplified out-of-phase signals are provided to FETs in an on-coil CMCD amplifier that drives an L-C leg to excite an MRI transmit coil to transmit an RF signal.

The method 700 may also include filtering an output of the on-coil CMCD amplifier with an L-C filter configured to resonate with an output parasitic impedance generated by the FETs in the on-coil CMCD amplifier at the high frequency. The L-C filter may be connected in parallel with respect to the transmit coil. Further, the method 700 may include matching an input impedance of the on-coil CMCD amplifier with capacitors connected between a gate and source of the FETs in the on-coil CMCD amplifier.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. An apparatus, comprising:
   a high frequency radio frequency (RF) signal generator to generate an RF signal at a high frequency;
   a balun network that inputs the RF signal with respect to ground and converts the input RF signal into a pair of first and second balanced out-of-phase signals with respect to ground at the high frequency;
   a push-pull amplifier comprising a first field effect transistor (FET) driven by the first out-of-phase signal and a second FET driven by the second out-of-phase signal, the first and second FETs being connected in a push pull configuration; and
   where the first and second FETs switch an on-coil current-mode class-D (CMCD) amplifier that includes two CMCD FETs that drive an inductance-capacitance (L-C) leg to control production of an RF signal at the high frequency by a transmit coil associated with high field parallel magnetic resonance imaging (MRI).

2. The apparatus of claim 1 where the balun network comprises a quarter-wavelength transmission line having a length substantially corresponding to an integer multiple of one quarter-wavelength of the high frequency RF signal, the transmission line being electrically connected to the RF signal generator to output the pair of balanced out-of-phase signals.

3. The apparatus of claim 1 where the balun network comprises wound wire transformer electrically connected to the RF signal generator to output the pair of balanced out-of-phase signals.

4. The apparatus of claim 1, where the high frequency is approximately 300 MHz and the high field parallel magnetic resonance imaging is performed with a base magnetic field of approximately 7 T.

5. The apparatus of claim 1, comprising an L-C filter connected in parallel between the on-coil CMCD and the transmit coil, the L-C filter being configured to resonate with an output parasitic impedance of CMCD FETs in the on-coil amplifier at the high frequency.

6. The apparatus of claim 1, comprising capacitors connected between a gate and source of the CMCD FETs, the capacitors being configured to increase input impedance with respect to the on-coil CMCD amplifier.

7. The apparatus of claim 1, comprising a class A amplifier disposed between the RF signal generator and the balun network to amplify the output of the RF signal generator.

8. The apparatus of claim 2, where the quarter-wavelength transmission line comprises a coaxial cable having a length that is substantially equal to an integer multiple of one quarter of the wavelength of the RF signal, where an inner conductor of the coaxial cable is connected to the RF signal at an input and a first conductor at an output, further where an outer shield layer of the coaxial cable is grounded at the input and is connected to a second conductor at the output, such that the first and second conductors provide the out-of-phase signals, with respect to ground.

9. An MRI apparatus, comprising:
a high frequency radio frequency (RF) signal generator to generate an RF signal at a high frequency;
a balun network electrically connected to the RF signal generator to output a pair of first and second balanced out-of-phase signals at the high frequency;
a push-pull amplifier comprising a first field effect transistor (FET) driven by the first out-of-phase signal and a second FET driven by the second out-of-phase signal, the first and second FETs being connected in a push pull configuration; and
where an L-C-switched-mode coil is controlled by an output of the push pull amplifier to output an analog RF signal at the desired frequency.

10. The MRI apparatus of claim 9 where the balun network comprises a quarter-wavelength transmission line having a length substantially corresponding to an integer multiple of one quarter-wavelength of the high frequency RF signal, the transmission line electrically connected to the RF signal generator to output a pair of first and second balanced out-of-phase signals at the high frequency.

11. The MRI apparatus of claim 9 where the balun network comprises a wound wire transformer electrically connected to the RF signal generator to output a pair of first and second balanced out-of-phase signals at the high frequency.

12. The MRI apparatus of claim 9, comprising an L-C filter connected in parallel between an on-coil CMCD amplifier and a transmit coil that make up the L-C switched mode coil, the L-C filter being configured to resonate with an output parasitic impedance of FETs in the on-coil CMCD amplifier at the high frequency.

13. The apparatus of claim 9, comprising capacitors connected between a gate and source of the CMCD FETs in the L-C switched mode coil, the capacitors being configured to increase input impedance with respect to the on-coil CMCD amplifier.

14. The apparatus of claim 9, comprising a class A amplifier disposed between the RF signal generator and the balun network to amplify the output of the RF signal generator.

15. A method, comprising:
receiving an RF signal having a high frequency;
generating an opposite phase signal comprising first and second out-of-phase signals by passing the RF signal through a balun network;
amplifying the first and second out-of-phase signals with a push-pull amplifier;
providing the amplified out-of-phase signals to CMCD FETs in an on-coil CMCD amplifier that drives an L-C leg to excite an MRI transmit coil to transmit an RF signal.

16. The method of claim 15 where the opposite phase signal is generated by passing the RF signal generator through a quarter-wavelength transmission line having a length substantially corresponding to an integer multiple of one quarter-wavelength of the high frequency RF signal.

17. The method of claim 15, comprising filtering an output of the on-coil CMCD amplifier with an L-C filter configured to resonate with an output parasitic impedance generated by the CMCD FETs in the on-coil CMCD amplifier at the high frequency, the L-C filter being connected in parallel with respect to the transmit coil.

18. The method of claim 15, comprising matching an input impedance of the on-coil CMCD amplifier with capacitors connected between a gate and source of the FETs in the on-coil CMCD amplifier.

* * * * *